United States Patent [19]

Landman et al.

[11] Patent Number: 5,191,541
[45] Date of Patent: Mar. 2, 1993

[54] METHOD AND APPARATUS TO IMPROVE STATIC PATH ANALYSIS OF DIGITAL CIRCUITS

[75] Inventors: Howard Landman, San Jose; Tim Bucher, Newark; Ser-hou Kuang, San Jose, all of Calif.

[73] Assignee: Sun Microsystems, Inc., Mountain View, Calif.

[21] Appl. No.: 523,015

[22] Filed: May 14, 1990

[51] Int. Cl.⁵ .............................................. G06F 15/60
[52] U.S. Cl. ..................................... 364/489; 364/488; 364/578
[58] Field of Search ............... 364/488, 489, 490, 491, 364/578; 371/23

[56] References Cited

U.S. PATENT DOCUMENTS

| 4,698,760 | 10/1987 | Lembach et al. | 364/490 |
| 4,703,435 | 10/1987 | Darringer et al. | 364/489 |
| 4,924,430 | 5/1990 | Zasio et al. | 364/578 |
| 4,961,156 | 10/1990 | Takasaki | 364/578 |
| 4,970,664 | 11/1990 | Kaiser et al. | 364/521 |

OTHER PUBLICATIONS

"MIS: A Multiple-Level Logic Optimization System" by Brayton et al., IEEE Trans. on Computer-Aided Design, vol. CAD-6, No. 6, Nov. 1987, pp. 1062-1081.
"Switch-Level Delay Models for Digital MOS VLSI" by J. K. Ousterhout, IEEE 21st Design Automation Conf. 1984, pp. 542-548.
"Timing Analysis for nMOS VLSI" by N. P. Jouppi, IEEE 20th Design Automation Conf. 1983, pp. 411-418.

Primary Examiner—Vincent N. Trans
Attorney, Agent, or Firm—Blakely, Sokoloff, Taylor & Zafman

[57] ABSTRACT

The method of the present invention includes steps wherein a circuit designer, using standard computer assisted design (CAD) tools, designs a circuit which may include multi-cycle paths (MCPs). The designer inserts a conceptual circuit element, referred to as a "path breaker" into multi-cycle paths, such that the result is to convert all multi-cycle paths into single cycle paths. The designer then utilizes functional simulation software to edit the circuit design. To the simulator, a path breaker appears to be a latch in which the latch output goes to an unknown state when the input changes, and remains so until the output has been clocked and is equal to the input. Traditional logic synthesis is then performed on the circuit such that a net list is generated which includes the path breakers. Based on the net list, a post processor determines where in the circuit multi-cycle paths exist and generates a net list without path breakers, as well as a list of the multi-cycle paths. The list of multi-cycle paths is provided to a static path analysis program where the locations of the multi-cycle paths denote exceptions. Timing analysis is then performed, and if the circuit is satisfactory, fabrication may be completed using the net list without the conceptual path breakers.

14 Claims, 4 Drawing Sheets

METHOD AND APPARATUS TO IMPROVE STATIC PATH ANALYSIS OF DIGITAL CIRCUITS

BACKGROUND OF THE INVENTION

1. FIELD OF THE INVENTION

The present invention relates to the field of static path analysis of digital circuits, and more particularly, to improved apparatus and methods for handling multi-cycle paths in simulation, static timing analysis and logic synthesis.

2. ART BACKGROUND

In designing a digital circuit, it is advantageous to conduct simulations with respect to timing analysis and logic synthesis prior to the finalization of the circuit design. Automated simulation and timing analysis programs have been developed to estimate circuit design performance prior to the fabrication of the digital circuit. For example, a program referred to as "MOTIVE" TM has been developed by Quad Design Technology of Camarillo, Calif. to conduct timing analysis of proposed digital circuits. Logic synthesis programs often attempt to improve the performance of a circuit design. When so doing, they must consider whether one circuit to implement a given function is faster than another. Hence, they must contain a subprogram to perform timing analysis.

Generally, there are two kinds of logic simulation. The first type is that which is purely functional and is sometimes called "zero delay" or "unit delay", such that the exact timing of each gate within a digital circuit is not considered in the simulation. The other form of logic simulation involves the simulation of the delays of each logic gate, and the determination of when signals arrive at certain locations within the circuit. This second type of logic simulation is commonly known as "timing logic simulation". Timing logic simulation attempts to determine the slowest electrical paths in a digital circuit. A variety of patterns of zeros and ones are provided to the circuit for purposes of simulating data pattens which the circuit may encounter. The use of timing logic simulation requires a significant amount of program time, and it is possible that if a particular data pattern is inadvertently not tested, the worst path in terms of delay will not be detected.

Static path analysis was developed as an improvement to timing logic simulation, wherein all possibilities of data paths are evaluated in one static pass through the proposed circuit. An advantage of static path analysis is that numerous data patterns need not be inputted into the circuit. All circuitry comprising the circuit is divided into combinational logic, where the output is purely a function of the inputs at the moment (plus some delay time for the signal to be driven through the combinational logic), and sequential logic where some memory buffering may occur. The most efficient design of a circuit frequently requires the use of multi-cycle paths (MCPs) which comprise sections of combinational logic whose delay exceeds the relevant clock cycle time. However, static path analysis assumes that a signal will propagate from one sequential element to another within one cycle. Accordingly, static timing analysis is made more complicated by the existence of multi-cycle paths.

Current approaches to handling multi-cycle paths and static timing analysis programs are inadequate. For example, in one prior art method called "exception noting", the static path analysis program allows a circuit designer to notify the timing analysis software that a path (say from point A to point B) in a digital circuit is a multi-cycle path taking N cycles. It is necessary for the designer to identify each such multi-cycle path manually, and create a file listing all MCPs. This process is error prone, and may lead to an inaccurate static timing analysis if the designer claims that a path is multi-cycle, when it in fact is not. In addition, if a value from a multi-cycle path in a zero delay simulation is read before it is actually in a valid state, no error will be detected. Also, the exception noting approach does not assist logic synthesis software to determine which paths on a design are really time critical. For example, if the clock cycle is 25 nanoseconds, a single cycle path taking 30 nanoseconds is much more important to optimize than a two cycle path taking 40 nanoseconds, but there is no mechanism for the synthesis software to take this into account. The synthesis software will, therefore, attempt to bring both paths into conformance with the 25 nanosecond limit. The program "MOTIVE" TM is of the type which requires exception noting for multi-cycle paths.

Another prior art method known as "latch insertion" eliminates multi-cycle paths from many circuits by physically adding digital "flip flops" to break the paths into single cycle segments. However, the addition of physical flip flops into the circuit to break the path up into single cycle segments adds additional cost and hardware size, and degrades performance since flip flops consume area and power, and have non-zero delay. In addition, they do not contribute any functionality to the circuit, and designers are very reluctant to insert them merely to assist a static path analysis program. However, the use of latch insertion does provide consistency among the simulation, timing analysis and logic synthesis of the design, since all of the programs currently in use are capable of recognizing the flip flops as valid circuit components.

As will be described, the present invention provides apparatus and methods to increase the performance of static path analysis by avoiding problems associated with multi-cycle paths in digital circuits. The present invention inserts conceptual devices referred to as "path breakers" into digital circuits to convert multi-cycle paths into single cycle paths. The simulation behavior of the path breaker is such that all access to a multi-cycle path at incorrect times gives an unknown result. The present invention's use of path breakers significantly improves static path analysis for digital circuits, and avoids errors inherent in static path analysis systems known in the prior art.

SUMMARY OF THE INVENTION

The present invention provides apparatus and methods which are most advantageously used in conjunction with static path analysis simulation techniques for digital circuit design. The method of the present invention includes steps wherein a circuit designer, using standard computer assisted design (CAD) tools, designs a circuit which may include multi-cycle paths (MCPs). The designer inserts a conceptual circuit element, referred to as a "path breaker" into multi-cycle paths, such that the result is to convert all multi-cycle paths into single cycle paths. The designer then utilizes functional simulation software to verify the circuit design. To the simulator, a path breaker appears to be a latch in which the latch output goes to an unknown state when the input changes, and remains so until the output has been clocked and is equal to the input. Traditional logic synthesis is then performed on the circuit such that a net list is generated which includes the path breakers. Based on the net list, a post processor determines where in the circuit multi-cycle paths exist and generates a net list without path breakers, as well as a list of the multi-cycle paths. The list of multi-cycle paths is provided to a static path analysis program where the locations of the multi-cycle paths denote exceptions. Timing analysis is then performed, and if the circuit is satisfactory, fabrication may be completed using the net list without the conceptual path breakers.

NOTATION AND NOMENCLATURE

Figure 1:
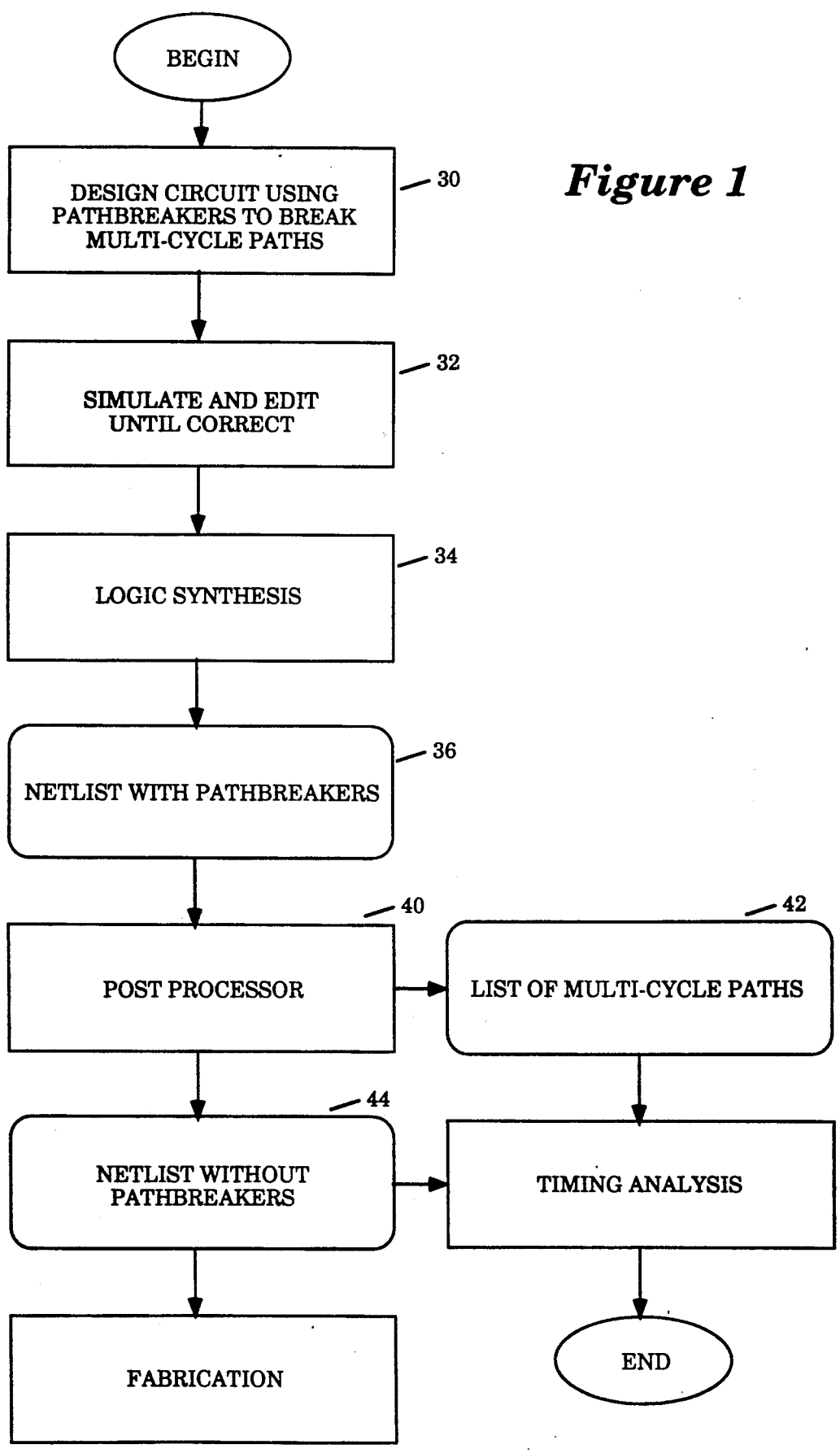
FIG. 1 is a flowchart illustrating the sequence of steps employed in one embodiment of the present invention.

The detailed description which follows is presented largely in terms of algorithms and symbolic representations of operations on data within a computer memory, and/or activities of a human circuit designer. These algorithmic descriptions and representations are the means used by those skilled in data processing arts to most effectively convey the substance of their work to others skilled in the art.

An algorithm is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, memory cells, display elements, or the like. It should be kept in mind, however, that all of these and similar terms are to be associated with the appropriate physical quantities and are merely convenient labels applied to these quantities.

Further, the manipulations performed are often referred to in terms, such as detecting, scanning, adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, the distinction between the method operations in operating a computer and the method of computation itself should be noted. The present invention relates to method steps for operating a computer and processing electrical or other (e.g. mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to any particular computer or other apparatus. In particular, various general purpose machines may be used with the teaching herein, or it may prove more convenient to construct more specialized apparatus to perform the required method steps. The required structure for a variety of these machines will be apparent from the description given below.

CODING DETAILS

No particular programming language has been indicated for carrying out the various procedures described herein. This is in part due to the fact that not all languages that might be mentioned are universally available. Each user of a particular computer will be aware of a language which is most suitable for his immediate purposes. In practice, it has proven useful to substantially implement the present invention in an assembly language which provides a machine executable object code. Because the computers and the monitor systems which may be used in practicing the instant invention consist of many diverse elements, no detailed program listing has been provided. It is considered that the operations and other procedures described herein and illustrated in the accompanying drawings are sufficiently disclosed to permit one of ordinary skill to practice the instant invention, or so much of it as is of use to him.

DETAILED DESCRIPTION OF THE INVENTION

An improved method and apparatus is disclosed having particular application when used in conjunction with static path timing analysis and simulation techniques for digital circuit design. In the following description, for purposes of explanation, numerous details are set forth such as specific timing analysis, programs, design methodologies and sequences, in order to provide a thorough understanding of the present invention. However, it will be apparent to one skilled in the art that these specific details are not required to practice the present invention. In other instances, well known electrical circuits and structures are shown in block diagram form in order not to obscure the present invention unnecessarily.

Figure 2A:
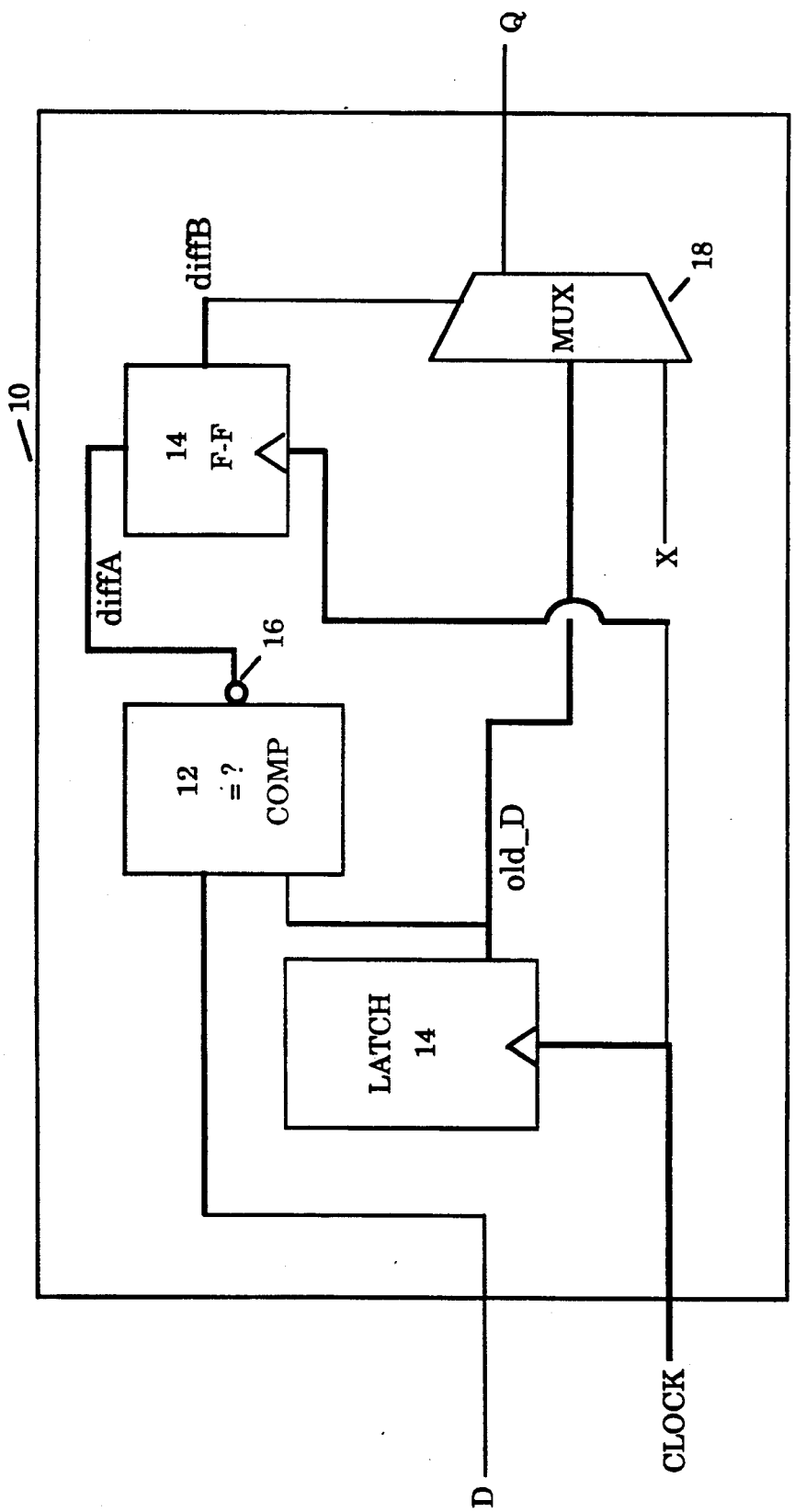
FIGS. 2A and 2B are block diagram and timing diagram of the conceptual structure and operation of a path breaker.
Figure 2B:
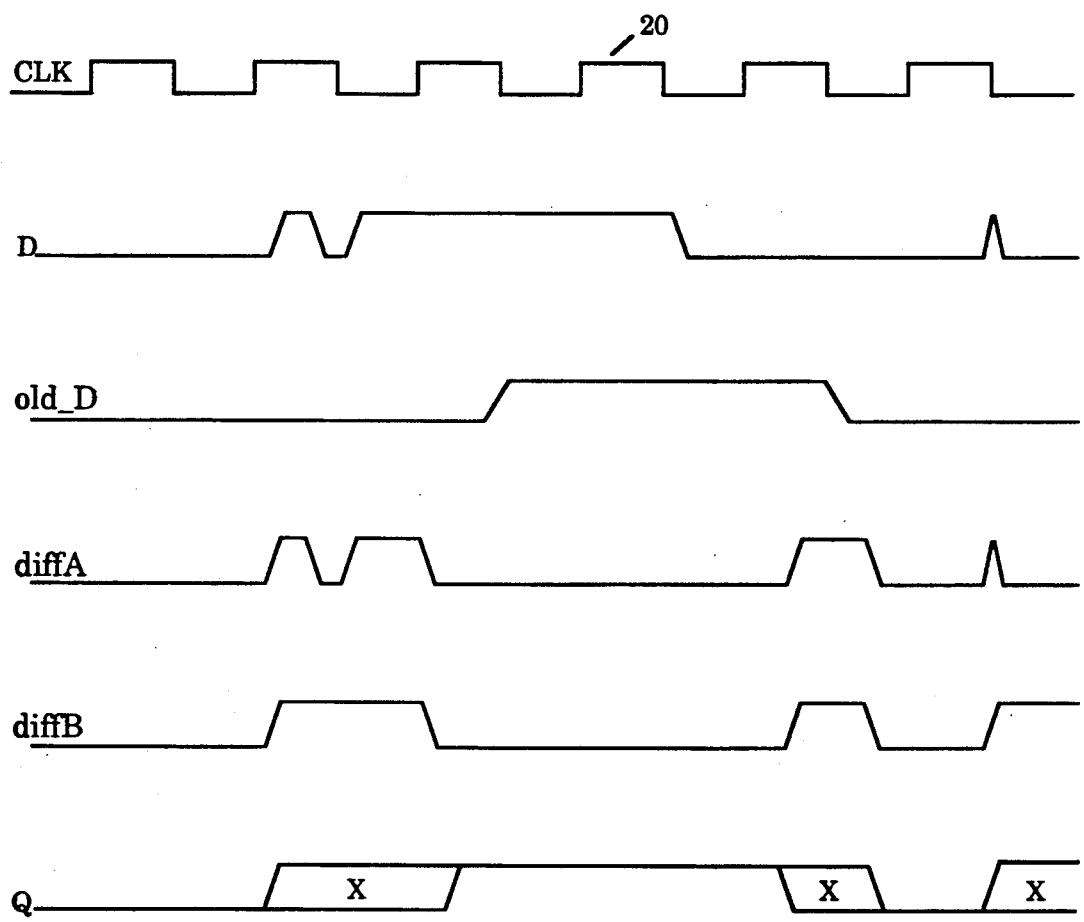

As previously discussed above, in designing a digital circuit, it is advantageous to conduct simulations with respect to timing analysis and logic synthesis prior to the fabrication of the circuit. As illustrated in FIG. 1, in the presently preferred embodiment of the invention, a circuit designer designs a circuit using "path breakers" to convert multi-cycle paths in the digital circuit into single cycle paths. As illustrated in FIGS. 2A and 2B, a path breaker 10 operates in a similar fashion to a latch, and the simulation behavior of the path breaker 10 is such that all access to a multi-cycle path at incorrect times gives an unknown result. In practice, the timing analysis behavior of the path breaker 10 is such that a timing analyzer operating on a circuit containing path breakers only detects single cycle paths. It is important to note, that the designer inserts a plurality of path breaker 10 devices only in the circuit design, and that the path breakers are actually conceptual devices which in reality are never fabricated onto the circuit. The path breaker includes an input port D and an output port identified in FIG. 2A as "Q". The conceptual path breaker 10, further includes a comparator 12 which is coupled to the input D and to the output of a latch 14 which has previously been clocked by the system clock such that it contains the value applied to port D on the previous clock cycle. Comparator 12 compares the current value of D with the previous value of D, and if those values are not equal, the comparator 12 generates a signal which is applied to line 16 (diff A), and coupled to a flip flop 14 with an asynchronous preset. As shown, flip flop 14 is coupled to the system clock, and the output of the flip flop 14 is coupled to a multiplexor 18. As shown in FIGS. 2A and 2B, if at any time the value of the current D is not equal to the value of D from the previous clock cycle, then the comparator 12 applies the signal (diff A) to line 16 which results in flip flop 14 latching a 1, and providing a signal (diff B) to multiplexer 18 for the remainder of the clock cycle. In the absence of signal diff B, the multiplexor 18 selects the previous value of D and provides this value to port Q. If, however, the current value of D has differed during this clock cycle from the previous value of D, then flip flop 14 provides signal diff B to the multiplexor 18 which results in an unknown value (X) applied to port Q. It will be noted that only where the current and previous values of D have differed is the unknown value (X) coupled to port Q. In FIG. 2B timing diagram illustrating the operation of path breaker 10 given a regular clock signal 20, and a signal at port D changing from low to high and back to low again, illustrates that the state of port Q is driven to the unknown state (X) only during those times in which the current value of D and the old value of D have not been equivalent.

In summary, the output of the path breaker 10 is consistent when the inputted signal at port D stays the same over multiple clock cycles (for example, a low state). If the inputted state at port D changes (for example to high) there is a period of up to one clock cycle where the output goes unknown (X), and this represents the time in which the signal might be propagating through a multi-cycle path. After the input to port D has remained the same for two or more clock cycles, the output at port Q changes to match the inputted level at port D. The path breaker 10 is designed such that the end of the unknown period (X) is the latest that it could possibly have taken for a signal to get through a multi-cycle path in the circuit.

It will be appreciated that, although the structure and operation of the path breaker 10 has been described, the path breaker 10 is conceptual in that although the designer places path breakers between multi-cycle paths in a circuit design, the path breaker itself is never actually fabricated onto a physical circuit. The purpose of placing the path breakers into multi-cycle paths of a designed circuit is to ensure that subsequent static path analysis and logic synthesis techniques will find only single cycle paths.

Referring once again to FIG. 1, once the designer utilizes standard computer aided design (CAD) tools to design the circuit, and inserts path breakers where he believes there are multi-cycle paths in the design (block 30), then functional simulation and editing of the design takes place (block 32). In the presently preferred embodiment, the circuit is designed using known functional blocks, such that once the operation of the circuit is deemed satisfactory, a logic synthesis program synthesizes the actual circuit in a well known manner (block 34). It is common for logic synthesis software to translate high level descriptions of the function of a particular circuit element into specific cells found within a cell library to implement the logic. As is well known, logic synthesis software permits a designer to operate at a functional level and then compiles the functional description into the actual circuit using logic synthesis tools, thereby replacing manual circuit design methods utilized in the prior art. It will be noted, that the steps illustrated in FIG. 1 to simulate, edit and conduct logic synthesis include the path breaker elements 10 previously inserted by the designer in the original design.

As illustrated in FIG. 1, the output from the logic synthesis (34) (namely the circuit design at the cell level including path breakers) is embodied as a net list 36, using standard well known techniques for the generation of a net list of a circuit design. It will be appreciated, that the net list 36 (including path breakers) could be coupled directly into a timing analysis system for purposes of conducting timing analysis of the proposed circuit, since the path breakers will appear to the standard timing analysis software as flip flops. However, as shown in FIG. 1, the presently preferred embodiment does not couple the net list 36 with path breakers to the timing analysis software. Since well known timing analysis software breaks the path between devices at the flip flop, and since the input loading and output drive of the path breakers 10 may not be the same as the previous or succeeding circuit cell, the input load may not be equivalent to the input load and output of the circuit without the path breaker. It is therefore possible that the results of the timing analysis may be slightly skewed. To improve the accuracy of the timing analysis, a post processor 40 removes the path breakers 10 from the net list 36, and generates a list of multi-cycle paths 42, and a separate net list 44 without path breakers (see FIG. 1).

Figure 3:
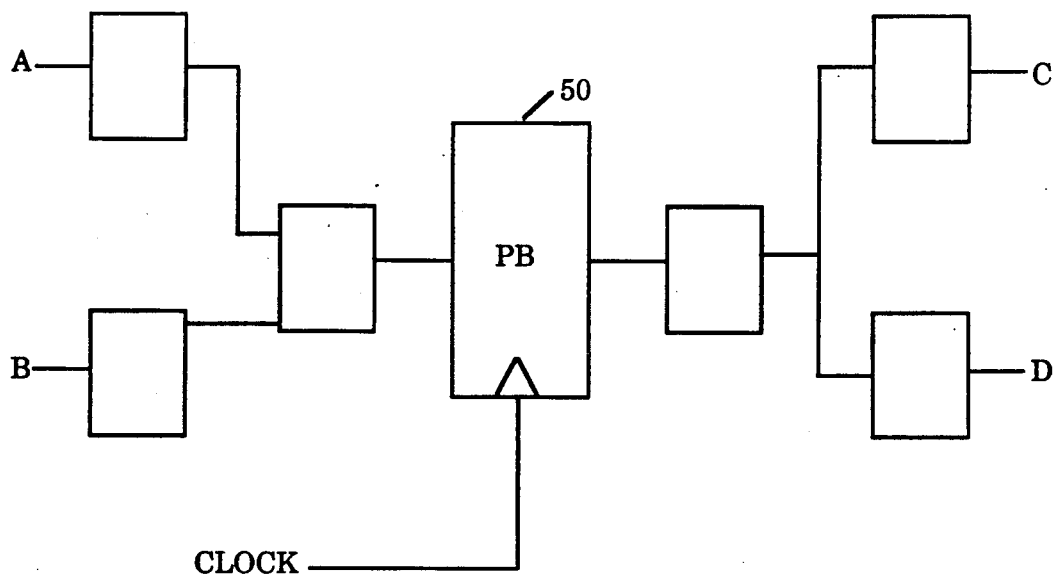
FIG. 3 illustrates the placement of a path breaker in a multi-cycle path to convert the multi-cycle path into two single-cycle paths.
Figure 4:
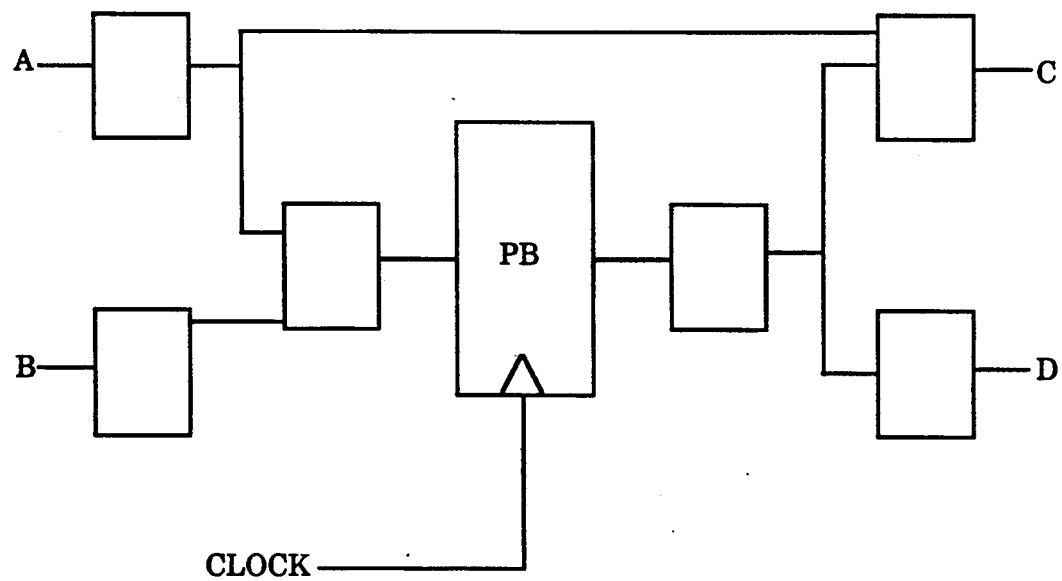
FIG. 4 illustrates the case where a path breaker is inserted into a multi-cycle path, and wherein there is also a single cycle path between circuit elements.

The post processor 40 removes the path breakers by scanning for them through the net list 36, and simply deleting them from the list. However, generating a list of multi-cycle paths 42, requires the post processor 40 to initially trace forward and backward from each path breaker 10 to find the beginning and the end of the multi-cycle path broken by it. For example, referring to FIG. 3, the post processor 40 begins its search at a path breaker 50 and identifies paths A to C, A to D, B to C, and B to D as two-cycle paths. However, as shown in FIG. 4, this simple approach would lead to an error if there was also a direct path from circuit component A to C. Accordingly, the post processor 40 must also check for unbroken paths between the circuit elements initially identified by looking forward and backward from a path breaker. In the case illustrated in FIG. 4, only paths A to D, B to C, and B to D are two-cycle paths. Path A to C is one-cycle, and therefore, would not be included on the list of multi-cycle paths 42 generated by the post processor 40.

In general, paths may be longer than 2 cycles. For each potential multi-cycle path, the software much check for the existence of a "shorter" path between the same endpoints, i.e., one passing through fewer path-breakers.

Referring once again to FIG. 1, the list of multi-cycle paths 42 denote exceptions for commercial static path timing analysis software (such as MOTIVE TM), which are supplied to the timing analysis software. Timing analysis is then performed on the proposed digital circuit wherein the exceptions (multiple cycles) are duly noted and handled accordingly. Since multi-cycle exceptions are generated only once they have been verified through functional simulation, it is not possible for the designer to err by claiming that a path is multiple cycle (and hence subject to relaxed timing constraints) when it is not. Accordingly, the method of the present invention for the simulation and timing analysis of multi-cycle paths is fully consistent throughout the design, simulation, and synthesis processes.

As illustrated, the net list without path breakers 44 is provided to the timing analysis software with the list of multi-cycle paths 42 (denoting exceptions). If the timing analysis provides satisfactory results, then fabrication of the actual circuit may be completed.

It will be appreciated that although the present embodiment, illustrated in the flow chart of FIG. 1, utilizes a post processor 40 to generate an exception list of multi-cycle paths and a net list without path breakers, that static path timing analysis may be conducted utilizing the net list with path breakers. The timing analysis software would, in such event, consider the path breakers as D-flip flops with no intrinsic delay, and with set up and hold times equal to the largest times of any real flip flop in the logic synthesis library. In addition, the timing analysis software would further assume that the output drive (Q) would be equal to the weakest output drive of any latch or buffer in the logic synthesis library. With these conservative assumptions, static path timing analysis may be completed with the path breakers subsequently removed from the circuit, and such removal could only improve the timing of the circuit. Accordingly, the presence of the path breakers during static timing analysis, and their subsequent remover prior to fabrication, would not create timing issues in the fabricated device.

Accordingly, apparatus and methods have been disclosed for improved static path timing analysis of digital circuits. While the present invention has been described with reference to FIGS. 1 through 4, it should be understood that the figures are for illustration only and should not be taken as limitations upon the invention. It is contemplated that many changes and modifications may be made, by one of ordinary skill in the art, without departing from the spirit and scope of the inventions described above.

We claim:

1. An improved method for conducting a static path analysis on an integrated circuit, said circuit including a plurality of circuit elements, comprising the steps of:

detecting multi-cycle paths between said circuit elements, said multi-cycle paths being combinations of said circuit elements in which a signal passing through said combination exceed a predetermined time period;

inserting path breaker circuit means between circuit elements of said circuit comprising said multi-cycle paths to break said multi-cycle paths into single cycle segments;

conducting a static path analysis on said circuit using static path analysis means wherein said path breaker circuit means appear to said static path analysis means as a latch;

wherein said path breaker circuit means comprises:
latch means coupled to an input D for latching a first digital signal applied to said input D upon the receipt of a clock signal;

comparator means coupled to said input D and to an output of said latch means, for comparing the current state of said a signal applied to said input D with the state of said first digital signal stored in said latch means, said comparator means providing a selector signal to a multiplexor if said signal applied to said input D is of the same state as the state of said signal stored in said latch means;

said multiplexor, upon the receipt of said selector signal, coupling the output of said latch means to an output Q of said path breaker circuit means; said multiplexor prior to the receipt of said selector signal coupling an unknown digital value (X) to said output Q.

2. An improved method for designing and testing an integrated circuit, said circuit including a plurality of circuit elements, comprising the steps of:

designing said circuit and inserting path breaker circuit means between elements of said circuit comprising multi-cycle paths, said multi-cycle paths being defined as combinations of said circuit elements in which the time for an electrical signal to pass through said combination exceeds a predetermined time (T) period;

generating a net list of said circuit including said path breaker circuit means;

conducting static path analysis of said circuit using static path analysis means;

removing said path breaker circuit means from said circuit and fabricating said circuit;

wherein said path breaker circuit means comprises:
latch means coupled to an input D for latching a first digital signal applied to said input D upon the receipt of a first clock signal;

comparator means coupled to said input D and to an output of said latch means, for comparing the current state of said a signal applied to said input D with the state of said first digital signal stored in said latch means, said comparator means providing a first selector signal to a flip flop if said signal applied to said input D is of the same state as the state of said signal stored in said latch means;

said flip flop, upon the receipt of a second clock signal, provides a second selector signal to a multiplexor;

said multiplexor, upon the receipt of said second selector signal, coupling the output of said latch means to an output Q of said path breaker circuit means; said multiplexor prior to the receipt of said selector signal coupling an unknown digital value (X) to said output Q.

3. The method as defined by claim 2 further including the step of processing said net list of said circuit, including said path breaker circuit means, to generate a list of multi-cycle paths denoting exceptions.

4. The method as defined by claim 3 further including the step of processing said net list of said circuit including said path breakers, to generate a net list of said circuit without said path breakers.

5. The method as defined by claim 4 wherein said static path analysis means is provided with said list of multi-cycle paths denoting exceptions, and said net list of said circuit without path breakers, for conducting said static path analysis.

6. The method as defined by claim 5 wherein after said step of designing said circuit said designer conducts logic synthesis on said circuit prior to generating said net list including said path breakers.

7. The method as defined by claim 6 wherein said designer conducts functional logic simulation on said circuit prior to said logic synthesis.

8. An improved circuit element, referred to as a path breaker, for use in the design of a digital circuit, comprising:
   latch means coupled to an input D for latching a first digital signal applied to said input D upon the receipt of a first clock signal;
   comparator means coupled to said input D and to an output of said latch means, for comparing the current state of said a signal applied to said input D with the state of said first digital signal stored in said latch means, said comparator means providing a first selector signal, if said signal applied to said input D is of the same state as the state of said signal stored in said latch means;
   multiplexor means for receiving selector signals;
   flip flop means coupled between said comparator means and said multiplexor means, wherein said flip flop means upon the receipt of a second clock signal provides a second selector signal to said multiplexor means;
   wherein said multiplexor means, upon the receipt of said second selector signal, couples the output of said latch means to an output Q of said path breaker and wherein said multiplexor means prior to the receipt of said selector signal couples an unknown digital value (X) to said output Q.

9. The path breaker as defined by claim 8 wherein said path breaker is coupled between other elements of a digital circuit comprising multi-cycle paths, said multi-cycle paths being defined as combinations of said circuit elements in which the time for an electrical signal to pass through said combination exceeds a predetermined time (T) period.

10. The path breaker as defined by claim 9 wherein said path breaker is conceptual and removed from said digital circuit design prior to fabrication of said circuit.

11. The path breaker as defined by claim 10 wherein said path breaker is removed from said digital circuit after conducting a static path analysis of said circuit.

12. The path breaker as defined by claim 10 wherein said path breaker is removed from said digital circuit after a list of multi-cycle paths are generated said list denoting exceptions.

13. The path breaker as defined by claim 12 wherein said list of multi-cycle paths and a net list of said digital circuit without path breakers are provided to timing analysis means for conducting static path analysis on said circuit.

14. The path breaker as defined by claim 13 wherein said digital circuit is fabricated upon the successful completion of said static path analysis.

* * * * *